United States Patent
Van Der Zaag et al.

[11] Patent Number: 5,904,996
[45] Date of Patent: May 18, 1999

[54] METHOD OF MANUFACTURING A MAGNETIC FIELD SENSOR

[75] Inventors: Pieter J. Van Der Zaag; Hendrik T. Munsters, both of Eindhoven, Netherlands

[73] Assignee: U.S. Philips Corporation, New York, N.Y.

[21] Appl. No.: 08/879,165

[22] Filed: Jun. 19, 1997

[30] Foreign Application Priority Data

Jul. 5, 1996 [EP] European Pat. Off. .............. 96201884

[51] Int. Cl.⁶ ........................... G11B 5/127; C23C 14/00
[52] U.S. Cl. ........................ 428/692; 428/900; 324/249; 324/252; 204/192.15; 204/192.2; 360/113; 360/119; 360/120; 338/32 R
[58] Field of Search ..................... 428/692, 900; 324/249, 252; 204/192.15, 192.2; 360/113, 119, 120

[56] References Cited

FOREIGN PATENT DOCUMENTS

| 0594243A2 | 4/1994 | European Pat. Off. .......... G11B 5/39 |
| 08129721 | 5/1996 | Japan ................................ G11B 5/39 |

OTHER PUBLICATIONS

Exchange anisotropy in coupled films of $Ni_{81}Fe_{19}$ with NiO and $Co_xNI_{1-x}O$. M.J. Carey and A.E. Berkowitz. American Institute of Physics, vol. 60, No. 24, Jun. 15, 1992, pp. 3060–3062.

Orientational dependence of the exchange biasing in molecular–beam–epitaxy–grown $Ni_{80}Fe_{20}/Fe_{50}Mn_{50}$ bilayers (invited). R. Jungblut et al. American Institute of Physics, vol. 75, No. 10, May 15, 1994, pp. 6659–6664.

Exchange coupling between NiO and NiFe thin films. J.X. Shen and M.T. Kief. American Institute of Physics, vol. 79, No. 8, Apr. 15, 1996, pp. 5008–5010.

Magneto–Resistive Heads Fundamentals and Applications. John C. Mallinson. Academic Press:CA. Chapter 6 and Chapter 7 pp. 50–57.

Philips Technical Review, vol. 44, No. 6, Dec. 1988, M.G.J. Heijman et al, "Multi–track magnetic heads in thin–film technology", pp. 169–178.

*Primary Examiner*—Stevan A. Resan
*Attorney, Agent, or Firm*—David R. Treacy

[57] ABSTRACT

A method of manufacturing a magnetic field sensor having a stacked structure of:

an exchange-biasing layer (2) comprising nickel oxide on a substrate (1) and a magnetic layer (3) which is exchange-biased with the exchange-biasing layer (2), whereby at least the exchange-biasing layer (2) is provided by sputter deposition using a sputter gas which comprises Ne and/or He. The magnetic layer (3) preferably comprises permalloy. In a particular embodiment, the magnetic layer (3) is separated from a second magnetic layer (5) by an interposed non-magnetic layer (4), so as to form a spin-valve trilayer.

5 Claims, 4 Drawing Sheets

METHOD OF MANUFACTURING A MAGNETIC FIELD SENSOR

BACKGROUND OF THE INVENTION

The invention relates to a method of manufacturing a magnetic field sensor having a stacked structure which comprises:

a substrate;

an exchange-biasing layer comprising nickel oxide;

a magnetic layer which is exchange-biased with the exchange-biasing layer, whereby at least the exchange-biasing layer is provided by sputter deposition.

Magnetic field sensors of this type may be employed inter alia:

- as magnetic heads, which can be used to decrypt the magnetic flux emanating from a recording medium in the form of a magnetic tape, disc or card;
- in compasses, for detecting the terrestrial magnetic field, e.g. in automotive, aviation, maritime or personal navigation systems;
- as field sensors in medical scanners, and as replacements for Hall probes in various other applications;
- as memory cells in Magnetic Random-Access Memories (MRAMs).

The term "nickel oxide" as employed throughout this text should be interpreted as referring to any stoichiometric or non-stoichiometric compound of nickel and oxygen. Although the symbol "NiO" will frequently be used in this context, this symbol should be viewed as encompassing compounds of the form $NiO_{1\pm\delta}$, in which $\delta$ is a positive fraction. The term "substrate" should be interpreted as referring to any body of material on which the exchange-biasing layer can be provided; such a body may therefore be composite (e.g. in the case of a glass plate coated with a layer of another material). It should be explicitly noted that the magnetic layer may be located above or below the exchange-biasing layer. Furthermore, the term "exchange-biasing" should be interpreted as encompassing both horizontal exchange-biasing (also referred to as longitudinal biasing) and vertical exchange-biasing (also referred to as perpendicular or transverse biasing).

A method as specified in the opening paragraph is known from European Patent Application EP 594 243, with the exception that the exchange-biasing layer therein described is comprised of an iron-manganese alloy (FeMn) instead of nickel oxide. In the described sensor, which exploits so-called spin-valve magneto-resistance effects, a first and a second layer of permalloy are magnetically coupled across an intervening layer of Cu, and the first permalloy layer is also exchange-biased with an adjacent FeMn layer. As a result of this exchange-biasing, the magnetization of the first permalloy layer is "pinned" in position; consequently, using an external magnetic field, the (free) magnetization of the second permalloy layer can be manipulated relative to the (fixed) magnetization of the first permalloy layer. Since the sensor's electrical resistance is dependent on the relative orientation of the magnetizations in the two permalloy layers, the sensor can thus be used to transcribe a fluctuating external magnetic flux into a correspondingly fluctuating electrical current.

In such sensors as hereabove described, the use of FeMn as an exchange-biasing material has certain attendant disadvantages. In particular, FeMn is highly sensitive to oxidation and other corrosion, which can destroy its exchange-biasing properties, or at least cause them to radically deteriorate. This is particularly the case in so-called "sensor-in-gap" magnetic heads, which are used in hard disc memories. Although attempts can be made to protect the FeMn layer using oxidation barriers (e.g. Ta layers), such barriers tend to reduce the magnetic sensitivity of the sensor, and are seldom completely effective in the long term.

As an alternative to FeMn, the use of an exchange-biasing layer comprising nickel oxide is discussed in an article by M. J. Carey and A. E. Berkowitz in Appl. Phys. Lett. 60 (1992), pp 3060–3062. A great advantage of such an exchange-biasing material is that, since it is already oxidic, it is insensitive to further oxidation. However, a disadvantage of nickel oxide is that its maximum exchange-biasing field $H_{eb}$ is considerably smaller than that of FeMn. This is undesirable because, as continuing miniaturization trends demand ever smaller field sensors, demagnetization effects in such miniaturized sensors become increasingly significant, so that adequate compensation accordingly requires increasing exchange-biasing fields $H_{eb}$. It should be noted that $H_{eb}$ is here defined as the field-axis displacement (from the zero-field line) of the hysteresis loop of an exchange-biased magnetic layer: see, for example, the article by R. Jungblut et al. in J. Appl. Phys. 75 (1994), pp 6659–6664.

In both the said article by Carey and Berkowitz and in EP 594 243, the exchange-biasing layer is provided using sputter deposition in an Ar-gas atmosphere. An advantage of sputter deposition is that it is highly compatible with large-scale, low-price industrial production, in contrast to techniques such as molecular beam epitaxy.

OBJECTS AND SUMMARY OF THE INVENTION

It is an object of the invention to provide a magnetic field sensor which is less sensitive to oxidation than prior-art sensors employing FeMn exchange-biasing layers. It is a further object of the invention that the new sensor should have a larger maximum exchange-biasing field ($H_{eb}$) than prior-art sensors using an exchange-biasing layer which comprises nickel oxide. Moreover, it is an object of the invention to provide a method of manufacturing the novel sensor in which at least the exchange-biasing layer is deposited using sputter deposition.

These and other objects are achieved according to the invention in a method as specified in the opening paragraph, characterized in that the said sputter deposition is conducted using a sputter gas which comprises Ne and/or He.

In experiments leading to the invention, the inventors sputter-deposited a selection of NiO/permalloy bilayers on a glass substrate in an Ar atmosphere, using various Ar pressures, and subsequently measured the exchange-biasing field $H_{eb}$ for each NiO layer. It transpired that the value of $H_{eb}$ decreased with increasing Ar pressure. The inventors interpreted this behaviour as an indication that lattice strain in the NiO, caused by Ar atoms at the substrate/NiO interface, was responsible to a significant extent for the exchange-biasing effects in the NiO, arguing that, at lower Ar pressures, more Ar atoms had the opportunity to settle into place at the said interface in the initiating NiO lattice. In an attempt to increase the degree of sputter-gas settlement at this interface, the inventors decided to experiment with a sputter gas having smaller atoms than Ar, seeing as such atoms might be more easily incorporated in the initiating NiO lattice. In subsequently sputter-deposited glass/NiO/permalloy samples, for which the sputter gas was Ne instead of Ar, the inventors achieved $H_{eb}$ values which were dramatically higher than those obtainable with Ar sputter gas.

Similarly advantageous results were achieved when the employed sputter gas comprised He. See FIG. 4, for example.

It should be noted that the reasoning employed by the inventors in arriving at the current invention is at variance with existing opinion. For example, in an article by J. X. Shen and M. T. Kief in J. Appl. Phys. 79 (1996), pp 5008–5010, the exchange-biasing mechanism in NiO is associated with interface roughness effects, and is expected to be strongest for low roughness levels; there is no postulated link with lattice strain. Moreover, since the roughness of Ar-sputtered films is generally observed to be lower than that of Ne-sputtered films, at a given sputter-gas pressure, the reasoning in the said article actually points away from the current inventive measure.

The inventors have also observed that, in a sensor manufactured according to the invention, the magnetic coercivity $H_c$ of the magnetic layer is lower than when the employed sputter gas is Ar: see FIG. 5, for example. Such a sensor advantageously has a larger dynamic range i.e. a larger range of external magnetic field strengths for which the magnetization in the magnetic layer remains "pinned" to the exchange-biasing layer.

A further advantage of the method according to the invention is that, when the exchange-biasing layer is deposited using Ne as a sputter gas (instead of Ar, for example), the exchange-biasing field $H_{eb}$ is less sensitive to (external) opposing demagnetizing fields. This can, for example, be demonstrated by applying a (strong) oppositely oriented magnetic field to a field-cooled sensor structure, maintaining this reversing field for a prolonged time t (e.g. of the order of 100 hours), and using a Kerr magnetometer to measure hysteresis loops as a function of t (in rapid measurements lasting only about 10 seconds per loop). From such loops, $H_{eb}$ can be measured, and is found to vary much less (with t) in the case of a Ne-sputtered exchange-biasing layer than in the case of an Ar-sputtered exchange-biasing layer.

The invention does not require the sputter gas to be comprised entirely of Ne or He; for example, mixtures such as Ne+Ar or He+Ar also yield improved results with respect to pure Ar (see FIG. 4, for example). Similarly, the invention does not require the exchange-biasing layer to be comprised entirely of nickel oxide; for example, in a particular embodiment of the sensor according to the invention, the exchange-biasing layer may comprise a mixture of nickel oxide and cobalt oxide.

The material of the magnetic layer may, for example, comprise Fe, Ni, Co, or one of their alloys; in particular, permalloy is a suitable and widely-used choice.

In a particular embodiment of the method according to the invention, only one magnetic layer is provided, and the resulting sensor makes use of the so-called Anisotropic Magneto-Resistance (AMR) effect, whereby the electrical resistance of the magnetic layer is dependent upon the orientation of its magnetization relative to the direction of an electrical current through the layer. An example of such a sensor is elucidated in FIG. 1 and Embodiment 1 herebelow.

In an alternative embodiment of the method according to the invention, the magnetic layer is separated from a second magnetic layer by an interposed non-magnetic layer, so as to form a trilayer. Such a non-magnetic layer may, for example, comprise Cu or Cr, and will typically have a thickness of the order of 1–5 nm. The resulting sensor makes use of the so-called Giant Magneto-Resistance (GMR) effect, whereby the electrical resistance of the sensor depends on the relative orientation of the magnetizations in the two magnetic layers. An example of such a sensor is elucidated in FIG. 2 and Embodiment 2 herebelow.

Another embodiment of the method according to the invention is characterized in that the sensor is provided with at least one flux guide, for the purpose of concentrating magnetic flux from an external source into the vicinity of the magnetic layer(s).

The sensor according to the invention may, if so desired, comprise various other layers besides those already referred to hereabove. Such layers may, for example, include additional magnetic layers and non-magnetic layers (e.g. arranged in a spin-valve multilayer structure), additional exchange-biasing layers, adhesion promoting layers (e.g. comprising Ta), anti-oxidation layers (e.g. comprising $SiO_2$ or $Si_3N_4$) or wear-resistant layers (e.g. comprising $Cr_2O_3$).

In a sensor manufactured according to the invention, the quantity of Ne or He typically incorporated at the substrate/ NiO interface is in excess of $10^{12}$ atoms/cm$^2$, and generally of the order of about $10^{13}$ atoms/cm$^2$. The presence of such Ne or He can be (quantitatively) verified using such analysis techniques as Thermal Gas Desorption (see, for example, FIG. 6). Since, as already set forth hereabove, the advantages associated with the inventive method are believed to derive (at least to a substantial extent) from the presence of Ne and/or He atoms at the substrate/NiO interface, the inventors also lay claim to a sensor as specified in claims 4 and 5. Besides using the method according to claim 1, such a sensor may, for example, be manufactured using Ne-ion implantation and/or He-ion implantation together with vapour deposition or laser ablation deposition; alternatively, such deposition may be performed in a partial Ne and/or He atmosphere.

BRIEF DESCRIPTION OF THE DRAWINGS

The invention and its attendant advantages will be further elucidated with the aid of exemplary embodiments and the accompanying schematic drawings, whereby.

Corresponding features in the various figures are denoted by the same reference symbols.

DESCRIPTION OF THE PREFERRED EMBODIMENTS

Embodiment 1

Figure 1:
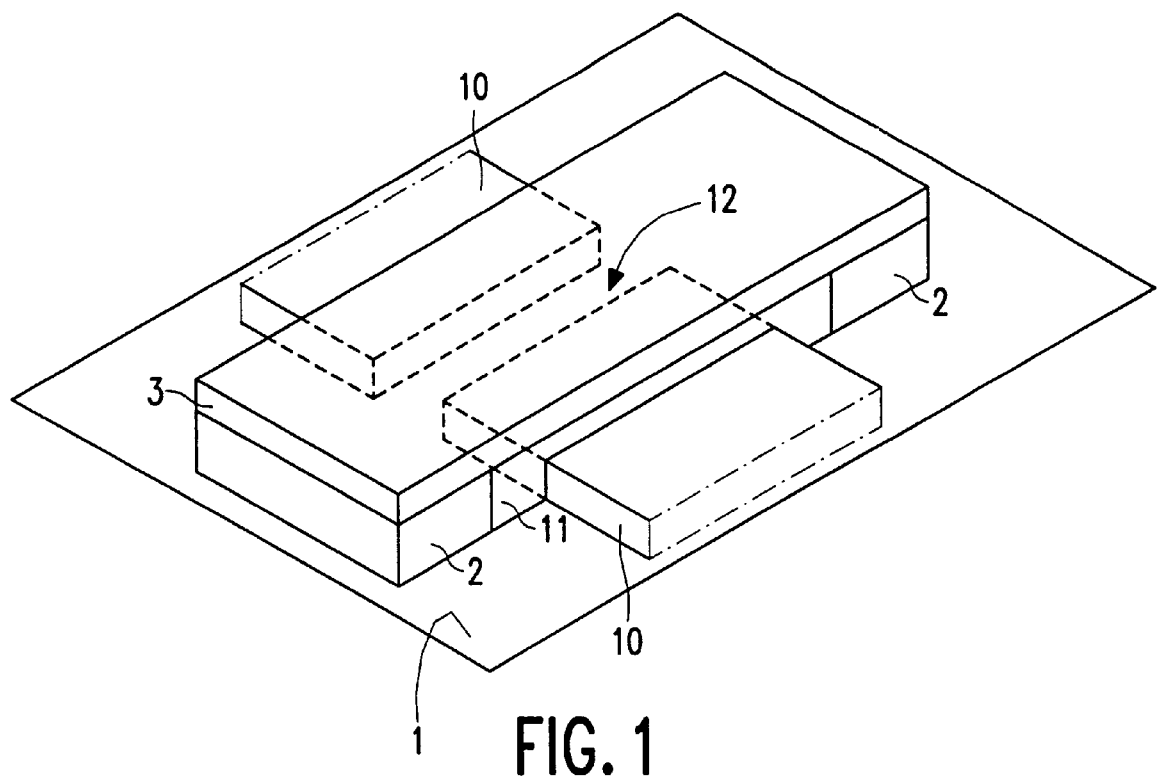
FIG. 1 is a perspective view of part of a particular embodiment of a magnetic field sensor (AMR sensor) according to the invention.

FIG. 1 renders a perspective view of part of a magnetic field sensor according to the invention. Such a sensor can be manufactured as follows.

Using an electroless technique such as sputter deposition, a non-magnetic substrate 1 (e.g. Si) is provided on one side with a uniform layer of soft magnetic material (e.g. a CoZrNb alloy). With the aid of selective masking and etching techniques well known in the art (see, for example, M. G. J. Heijman et al., Philips Technical Review 44 (1988), pp 169–178, and particularly pp 174–177), this layer is subsequently formed into two strips 10 which face each other across an intervening gap 12; in this manner, two flux guides 10 are created on the substrate 1.

In a similar fashion, the substrate 1 is provided with two "blocks" 2 of NiO, which straddle the flux guides 10. The NiO is sputter-deposited in a HV magnetron device using Ne as a sputter gas, and employing, for example, the following sputter parameters:

background pressure: $2.66 \times 10^{-5}$ Pa (0.2 µTorr);
sputter-gas pressure: 0.8 Pa (6 mTorr);
substrate-holder temperature: 200° C.

The area between the blocks 2 is subsequently filled with a body 11 of electrically insulating material (e.g. $SiO_2$), flush with the upper surface of the blocks 2. A strip-like "bridge" 3 of magneto-resistive material (e.g. permalloy) is then provided on top of the blocks 3 and across the body 11.

The device thus created therefore has a layered structure which consecutively comprises a substrate 1, an exchange-biasing layer 2, and a magnetic layer 3 which is exchange-biased to the layer 2 and which acts as an AMR sensor. By exchange-biasing the strip-like layer 3 at its two extremities, it is endowed with a single-domain structure (see, for example, *Magneto-Resistive Heads: Fundamentals and Applications*, J. C. Mallinson, Academic Press Inc. (1996), ISBN 0-12466630-2: Chapter 6). The device further comprises flux guides 10 and an intervening gap 12 which are so arranged that concentrated magnetic flux carried by the guides 10 emerges from the gap 12 and intercepts the magnetic layer 3.

Embodiment 2

Figure 2:
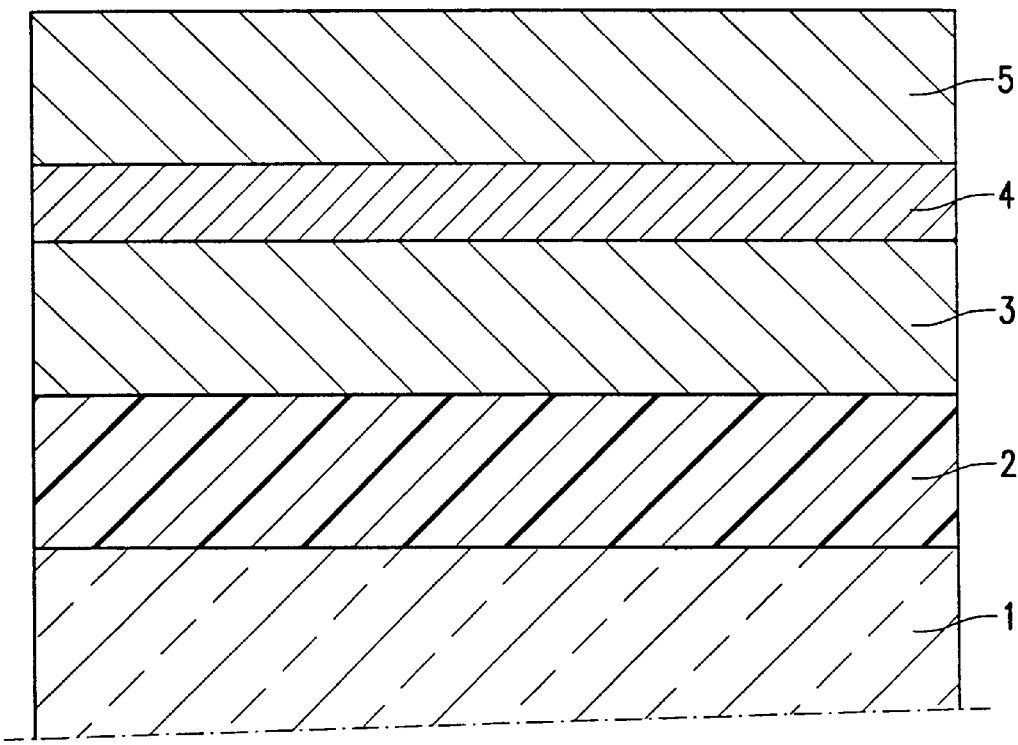
FIG. 2 is a cross-sectional view of part of an alternative embodiment of a magnetic field sensor (GMR sensor) according to the invention.

FIG. 2 cross-sectionally depicts part of a particular embodiment of a magnetic field sensor according to the invention. This sensor has a stacked structure which consecutively comprises a substrate 1, an exchange-biasing layer 2 which comprises NiO, a first magnetic layer 3 which is exchange-biased with the layer 2, a non-magnetic layer 4 and a second magnetic layer 5. The layers 3,4,5 form a spin-valve trilayer. In accordance with the invention, the layer 2 has been provided by HV magnetron sputter-deposition, using Ne as a sputter gas. The particular sputter parameters in this case were as follows:

background pressure: $2.66 \times 10^{-5}$ Pa (0.2 µTorr);
sputter-gas pressure: 1.06 Pa (8 mTorr);
substrate-holder temperature: 200° C.

In this particular example, the substrate 1 comprises a glass plate. The magnetic layers 3,5 may, for example, comprise Fe, Co, Ni, or one of their alloys (such as permalloy). The non-magnetic layer 4 may, for example, comprise Cu. Exemplary thicknesses for the various layers are as follows:

| | | |
|---|---|---|
| 2 | 50 | nm; |
| 3 | 6 | nm; |
| 4 | 3 | nm; |
| 5 | 8 | nm. |

In a particular embodiment, the magnetic layers 3,5 are ferromagnetically coupled to one another across the intervening layer 4. Consequently, in the absence of an external magnetic field, the magnetizations in the layers 3,5 will be mutually parallel.

In an alternative embodiment, so-called magnetic annealing is employed during growth of the magnetic layers 3,5 so as to achieve a situation whereby their magnetizations are substantially mutually perpendicular in the absence of an external magnetic field. Such a sensor is, for example, elucidated in EP 594 243 (in which, however, the employed exchange-biasing material is FeMn instead of NiO).

Embodiment 3

Figure 3:
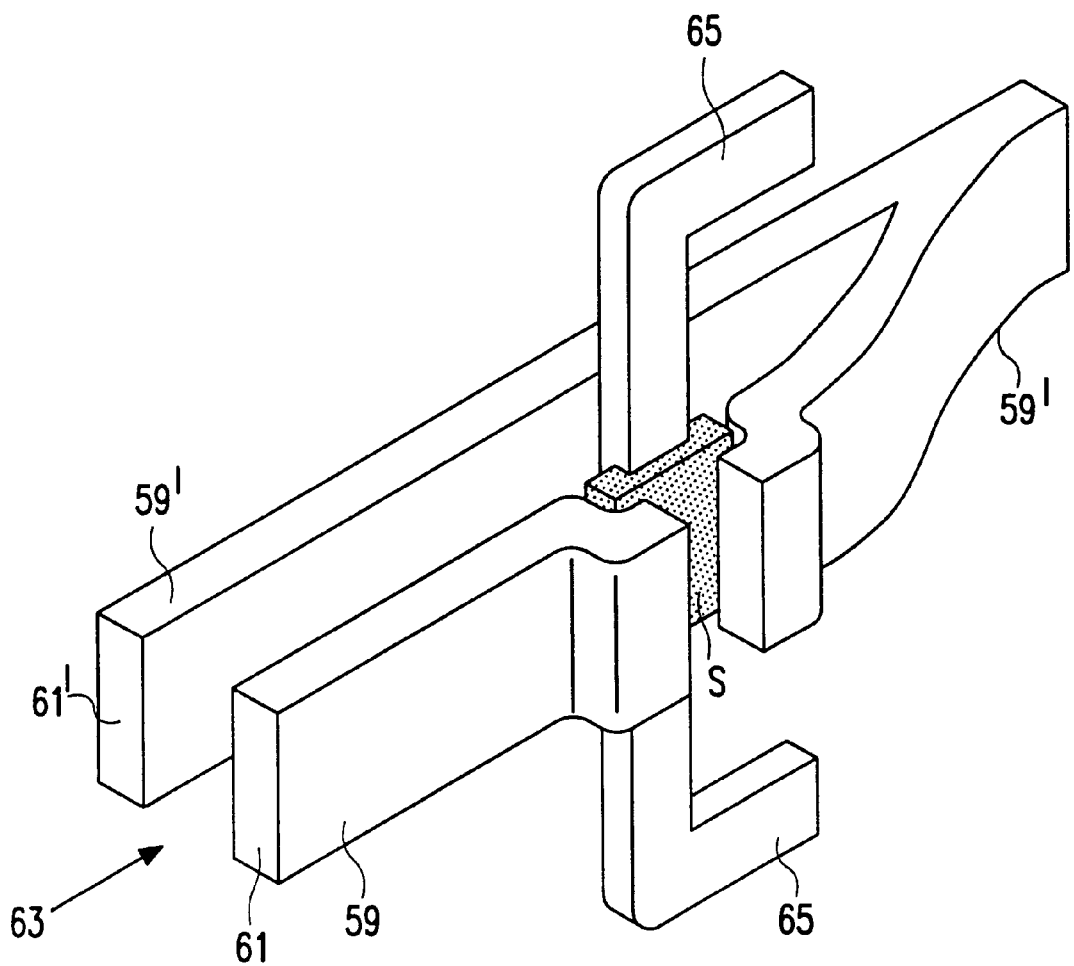
FIG. 3 renders a perspective view of a magnetic read head (magnetic field sensor) according to the invention, having flux guides and electrical connections.

FIG. 3 renders a schematic perspective view of part of a magnetoresistive magnetic read head (magnetic field sensor) according to the invention. The head comprises a transducer S (e.g. an AMR sensor as described in Embodiment 1 or a GMR sensor as described in Embodiment 2) with electrical connections 65. The head additionally comprises flux guides 59,59', which are positioned relative to the transducer S so as to form a magnetic circuit. The end faces 61,61' form part of the pole face of the head, the magnetic gap 63 being located between said faces 61,61'.

If a magnetic medium, such as a magnetic tape, disc or card, passes before the faces 61,61' in close proximity thereto, the magnetically-stored information on that medium will generate a varying magnetic flux in the above-mentioned magnetic circuit, which magnetic flux is also fed through the transducer S. The transducer S transcribes this varying magnetic flux into electrical resistance variations, which can be measured via the electrical connections 65.

The head may also contain an electrical coil, which can be employed in the recording of magnetic information on magnetic media.

Embodiment 4

Figure 4:
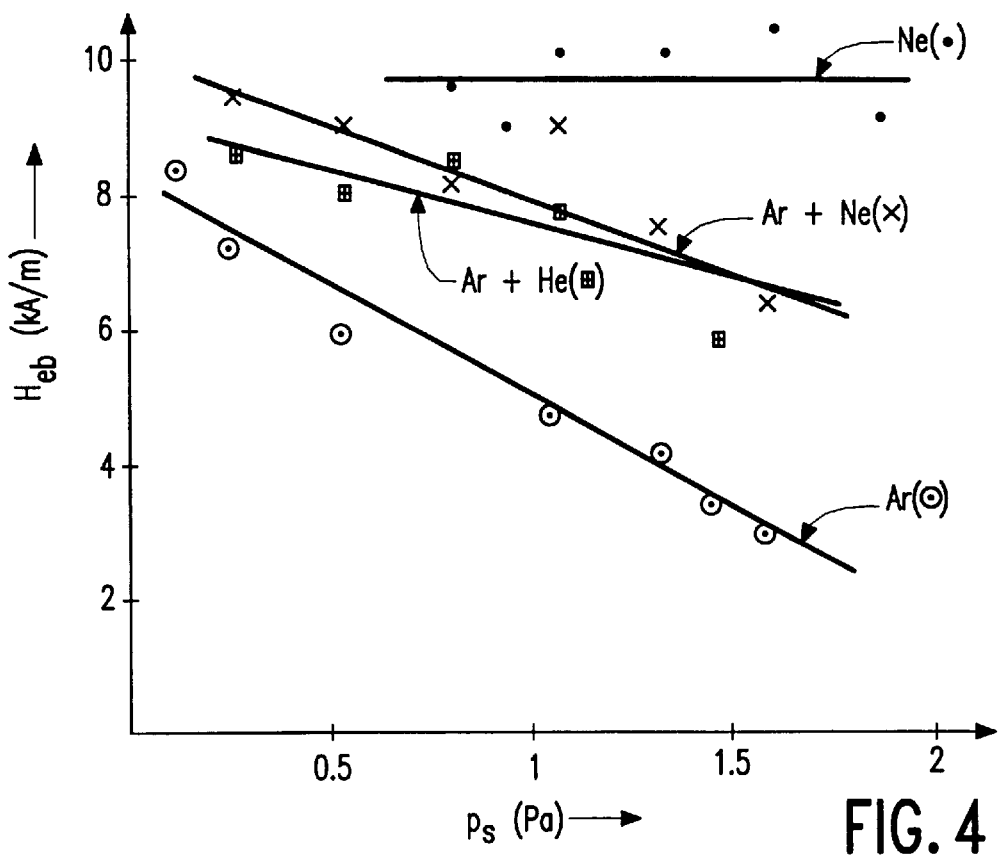
FIG. 4 graphically depicts the dependence of the exchange-biasing field $H_{eb}$ (kA/m) on the sputter-gas pressure $p_s$ (Pa) for sputter-deposited glass/NiO/permalloy samples, using various sputter gases.

FIG. 4 graphically depicts the dependence of the exchange-biasing field $H_{eb}$ (in kA/m) on sputter-gas pressure $p_s$ (in Pa) for sputter-deposited glass/NiO/permalloy samples, using various sputter gases (Ar, Ar+Ne, Ar+He, Ne). All of the sputtered samples had the following composition:

glass/50 nm NiO/6 nm $Ni_{80}Fe_{20}$/6 nm Cu, the purpose of the Cu layer being to protect the permalloy layer from oxidation. The lines in the graphs serve as guides to the eye.

All $H_{eb}$-measurements were conducted at room temperature (290 K) using a SQUID magnetometer. The data for "Ar+Ne" relate to a mixture of Ar and Ne in a partial-pressure ratio 1:1, whereas the data for "Ar+He" relate to a mixture of Ar and He in a partial-pressure ratio 3:1. On the other hand, the data for "Ar" and "Ne" relate to pure Ar and Ne, respectively.

It is evident from the graph that, for any given value of $P_s$, the corresponding value of $H_{eb}$ is lowest for Ar and highest for Ne, with intermediate values for the mixtures Ar+He and Ar+Ne.

Figure 5:
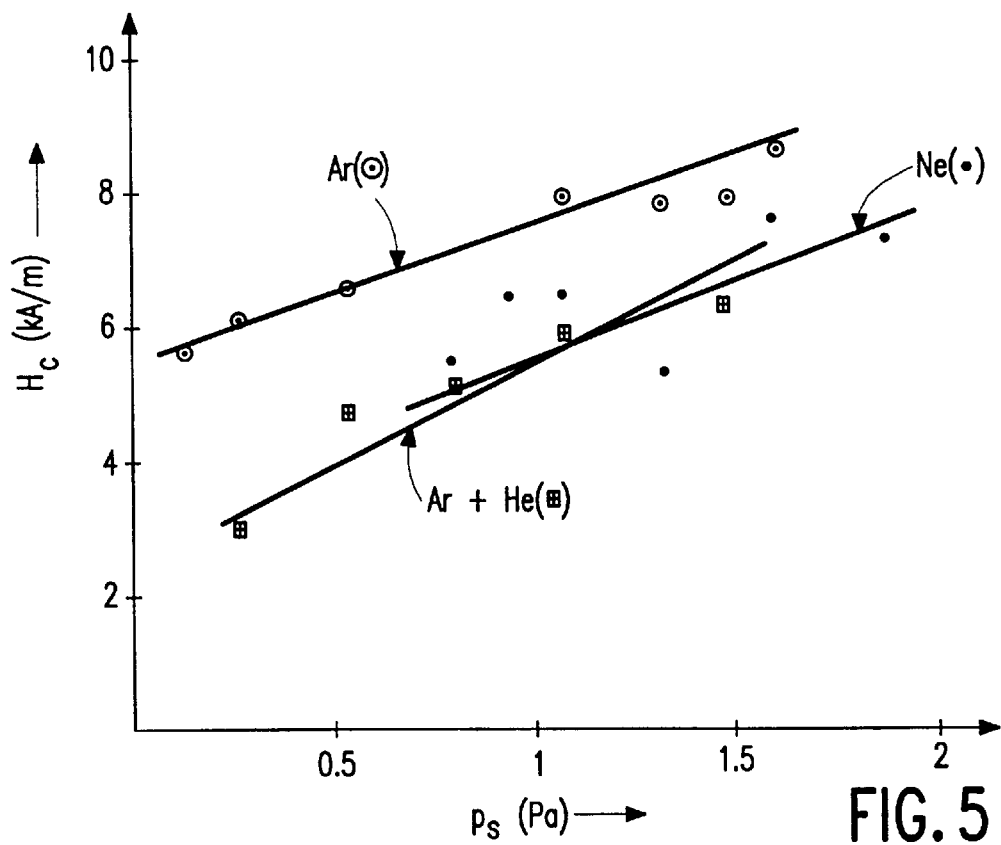
FIG. 5 graphically depicts the dependence of the coercive field $H_c$ (kA/m) on the sputter-gas pressure $p_s$ (Pa) for the same samples to which FIG. 4 pertains.

FIG. 5 graphically depicts the dependence of the coercive field $H_c$ (in kA/m) on sputter-gas pressure $p_s$ (in Pa) for the same glass/NiO/permalloy samples referred to hereabove. It is evident from the graph that, for any given value of $p_s$, the corresponding value of $H_c$ is highest for Ar, and considerably lower when the employed sputter gas comprises Ne or He.

Embodiment 5

Figure 6:
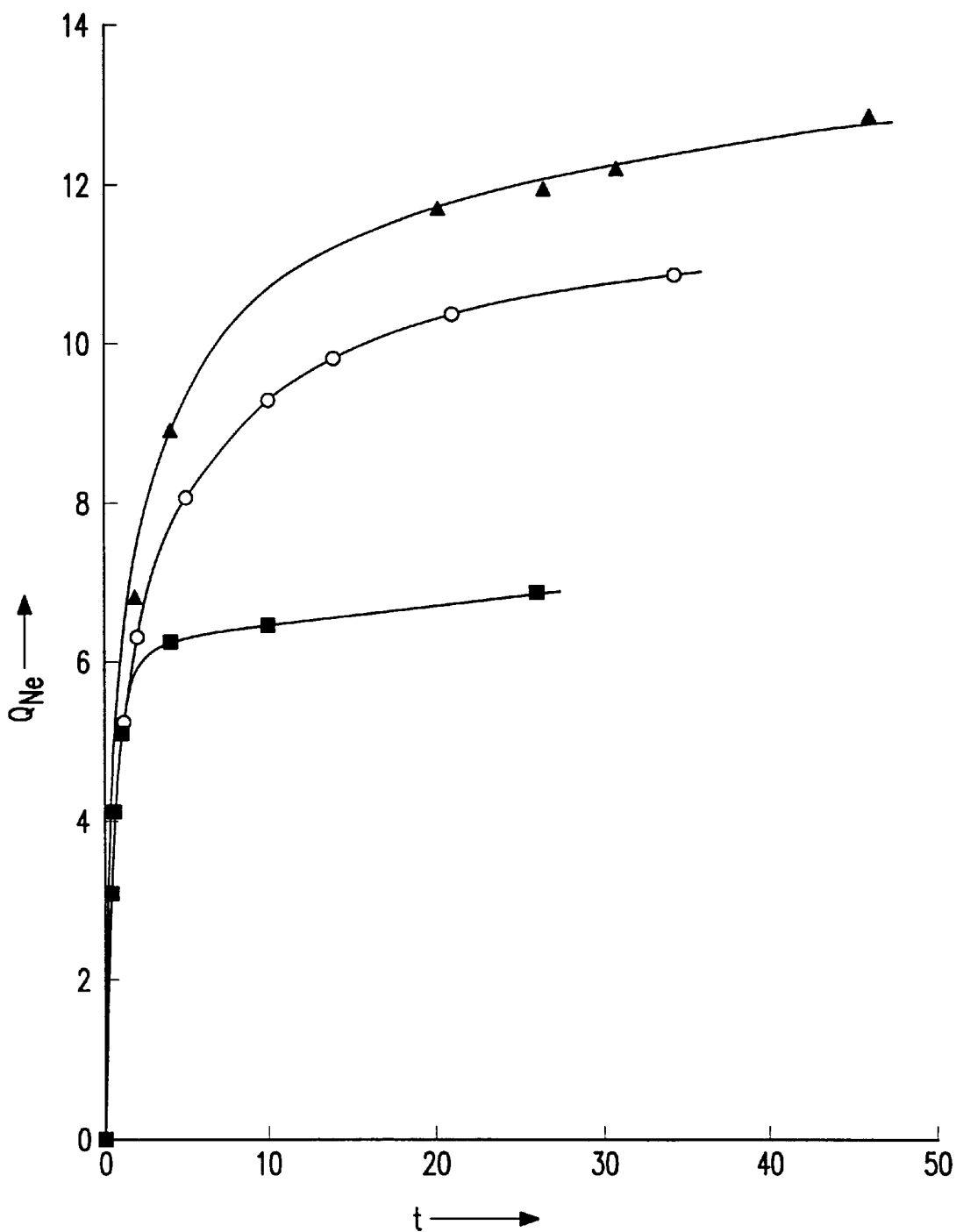
FIG. 6 graphically depicts the results of Thermal Gas Desorption experiments conducted upon magnetic field sensors according to the invention, revealing the presence of Ne atoms in such sensors.

FIG. 6 graphically depicts the results of Thermal Gas Desorption experiments conducted upon magnetic field sensors according to the invention, revealing the presence of Ne atoms in such sensors.

In each such experiment, a field sensor such as that elucidated in Embodiment 1 was placed in a vacuum chamber fitted with a Zr—C getter. Each sample was placed in a quartz tube, and was heated to a temperature of approximately 500° C., after evacuation of the chamber to a given background pressure. This temperature was maintained for a prolonged time t, causing the escape of Ne gas from the samples, together with "unwanted" gases such as $H_2O$, $CO_2$, $C_xH_y$, etc. The getter was maintained at a temperature of about 400° C., and absorbed these unwanted gas atoms; the Ne, however, was not absorbed by the getter, allowing the quantity $Q_{Ne}$ of escaped Ne atoms to be determined using mass spectrometry.

FIG. 6 renders a plot of $Q_{Ne}$ (Pa.1/m$^2$) as a function of t (hours) for various sensors, each having being manufactured using a different Ne sputter-gas pressure during provision of the exchange-biasing layer (viz. 6 mTorr (▲), 8 mTorr (○) and 11 mTorr (■)). The graph clearly reveals the presence of Ne atoms in all the sensors.

Embodiment 6

In Embodiments 1 and 2, the NiO exchange-biasing layer is in contact with the substrate. In an alternative experiment, the inventors manufactured several "inverted" sensor structures having the following composition:

Si(substrate)/6 nm $Ni_{80}Fe_{20}$/50 nm NiO.

In all the sensors, the $Ni_{80}Fe_{20}$ layer was sputtered in Ar at a pressure of 5 mTorr and in a magnetic field of 15 kA/m. However, the NiO exchange-biasing layers in the various sensors were sputtered using different sputter gases and at various sputter-gas pressures, as listed in the following table.

| sensor | gas | gas pressure | $H_{eb}$ | $H_c$ |
|--------|-----|--------------|----------|-------|
| 1 | Ar | 1 | 3.8 | 7.4 |
| 2 | Ar | 3 | 1.6 | 6.1 |
| 3 | Ar + Ne | 2 | 12.2 | 2.9 |
| 4 | Ne | 6 | 18.5 | 9.1 |
| 5 | Ne | 7 | 34.3 | 7.9 |

The (sputter) gas pressure is expressed in mTorr. $H_{eb}$ and $H_c$ are expressed in Oe, and were determined using a SQUID magnetometer (at 290 K). All depositions occurred at room temperature.

From the table, it is immediately evident that use of pure Ar as a sputter gas (sensors 1 and 2) leads to a practically useless sensor, since $H_c > H_{eb}$. On the other hand, incorporation of Ne into the sputter gas (sensors 3–5) results in the condition $H_{eb} > H_c$, and also in very much larger values of $H_{eb}$.

We claim:

1. A method of manufacturing a magnetic field sensor having a stacked structure which comprises:

a substrate;

an exchange-biasing layer comprising nickel oxide;

a magnetic layer which is exchange-biased with the exchange-biasing layer, whereby at least the exchange-biasing layer is provided by sputter deposition, characterized in that the said sputter deposition is conducted using a sputter gas which comprises Ne and/or He.

2. A method according to claim 1, characterized in that the magnetic layer is separated from a second magnetic layer by an interposed non-magnetic layer, so as to form a trilayer.

3. A method according to claim 1, characterized in that the sensor is provided with at least one flux guide.

4. A magnetic field sensor having a stacked structure which comprises:

a substrate;

an exchange-biasing layer comprising nickel oxide;

a magnetic layer which is exchange-biased with the exchange-biasing layer, characterized by the presence of Ne and/or He atoms at the interface between the substrate and the exchange-biasing layer.

5. A magnetic field sensor according to claim 4, characterized in that the quantity of Ne and/or He atoms at the said interface is at least $10^{12}$ atoms/cm$^2$.

* * * * *